US008878552B2

(12) United States Patent
Cordoba Galera et al.

(10) Patent No.: US 8,878,552 B2
(45) Date of Patent: Nov. 4, 2014

(54) END-OF-LINE CAPACITOR FOR MEASURING WIRING IMPEDANCE OF EMERGENCY NOTIFICATION CIRCUITS

(75) Inventors: Andres Cordoba Galera, Barcelona (ES); William Edwards, Bradenton, FL (US); Joseph Peter Calinski, Bradenton, FL (US); Donald Becker, Bradenton, FL (US); Antonio Gonzalez Requejo, Barcelona (ES); Miguel Angel Perez Gandara, Barcelona (ES)

(73) Assignee: UTC Fire and Security Americas Corp., Inc., Farmington, CT (US)

( * ) Notice: Subject to any disclaimer, the term of this patent is extended or adjusted under 35 U.S.C. 154(b) by 364 days.

(21) Appl. No.: 13/323,522

(22) Filed: Dec. 12, 2011

(65) Prior Publication Data

US 2013/0147495 A1 Jun. 13, 2013

(51) Int. Cl.
*G01R 27/26* (2006.01)

(52) U.S. Cl.
USPC ........... 324/658; 324/519; 324/525; 324/226; 324/239; 340/506; 340/514; 340/530; 340/652

(58) Field of Classification Search
USPC ................. 324/658, 525, 691, 519, 226, 239; 340/506, 530, 652, 514, 507, 331, 577, 340/628, 584, 517, 524, 540
See application file for complete search history.

(56) References Cited

U.S. PATENT DOCUMENTS

| | | | | | |
|---|---|---|---|---|---|
| 2,684,475 | A | * | 7/1954 | Lode | 340/508 |
| 3,641,539 | A | * | 2/1972 | Lesher | 340/549 |
| 4,162,489 | A | * | 7/1979 | Thilo et al. | 340/518 |
| 4,191,946 | A | | 3/1980 | Knox et al. | |
| 4,287,515 | A | * | 9/1981 | Raber et al. | 340/584 |
| 4,481,502 | A | * | 11/1984 | Dawson | 340/516 |
| 4,529,970 | A | * | 7/1985 | Wynne | 340/506 |
| 4,568,923 | A | * | 2/1986 | Ouchi | 340/584 |
| 4,952,906 | A | * | 8/1990 | Buyak et al. | 340/331 |
| 5,406,129 | A | * | 4/1995 | Gilmartin et al. | 307/125 |
| 6,104,286 | A | * | 8/2000 | Luquette | 340/506 |
| 6,445,598 | B1 | * | 9/2002 | Yamada | 363/21.12 |
| 6,567,001 | B1 | * | 5/2003 | Barrieau et al. | 340/506 |
| 7,199,587 | B2 | * | 4/2007 | Hurwicz | 324/424 |
| 7,372,369 | B2 | * | 5/2008 | Larkin | 340/652 |
| 2008/0001726 | A1 | * | 1/2008 | Stewart et al. | 340/331 |

FOREIGN PATENT DOCUMENTS

| | | | |
|---|---|---|---|
| EP | 405247 | B1 | 12/1995 |
| GB | 2101784 | A | 1/1983 |

OTHER PUBLICATIONS

European Patent Office Communication, Notification of Transmittal of the International Search Report and the Written Opinion of the International Searching Authority from International Application No. PCT/US2012/063176 dated Feb. 6, 2013, 11 Pages.

* cited by examiner

*Primary Examiner* — Tung X Nguyen
*Assistant Examiner* — Thang Le
(74) *Attorney, Agent, or Firm* — Cantor Colburn LLP

(57) ABSTRACT

A system includes a capacitor, a plurality of notification devices connected in parallel with the capacitor, and a controller. The controller is capable of determining capacitance of the capacitor during charge-up of the capacitor, and the controller is capable of determining the wiring impedance of the emergency notification circuit during discharge of the capacitor.

18 Claims, 2 Drawing Sheets

END-OF-LINE CAPACITOR FOR MEASURING WIRING IMPEDANCE OF EMERGENCY NOTIFICATION CIRCUITS

BACKGROUND

The present invention relates to testing emergency notification circuits, and specifically to a system and method for testing the wiring impedance of emergency notification circuits using an end-of-line capacitor.

Emergency notification circuits provide power to a plurality of notification devices such as sirens and strobe lights. These devices are used to alert persons in the area of an emergency condition. Therefore, it is necessary to ensure the continuous functionality of these devices.

Each notification device requires a working voltage and current to operate. The wires that provide the voltage and current to the devices have an impedance themselves. If a condition occurs which causes the wiring impedance to change, such as a short circuit or open circuit condition, the notification devices may not receive the proper working voltage and current. It is therefore necessary to monitor the wiring impedance of the emergency notification circuit in order to ensure continuous operation of every notification device.

Previous circuits have utilized an end-of-line resistor in parallel with the notification devices in order to monitor for short circuit and open circuit conditions. To test the circuit, the voltage across the notification devices is reversed so as not to turn on the devices. The current through the resistor is monitored to determine if there is a short circuit condition or an open circuit condition. However, a condition causing the wiring impedance to rise but not fully cause an open circuit condition, such that some notification devices do not receive a working voltage and current, is not detectable by the end-of line resistor configuration.

SUMMARY

A system and method includes an end-of-line capacitor, an emergency notification circuit, a plurality of notification devices, a reference resistor, and a controller. The plurality of notification devices are connected in parallel with the end-of-line capacitor. The capacitor is discharged through the reference resistor. The controller is configured to determine the wiring impedance of the emergency notification circuit during discharge of the capacitor by monitoring voltage across the reference resistor.

DETAILED DESCRIPTION

The present invention involves monitoring the impedance of a notification appliance circuit (NAC), and in particular a system and method for monitoring the impedance of a NAC using an end-of-line capacitor. The system includes a capacitor, a controller, and a NAC used to power a plurality of notification devices, such as sirens or strobe lights. The capacitor is connected in parallel with the plurality of notification devices and is charged and discharged in order to determine the wiring impedance of the NAC. A controller monitors the voltage across a reference resistor during discharge of the capacitor in order to determine the wiring impedance of the NAC based upon the RC time constant of the discharge circuit.

Figure 1:
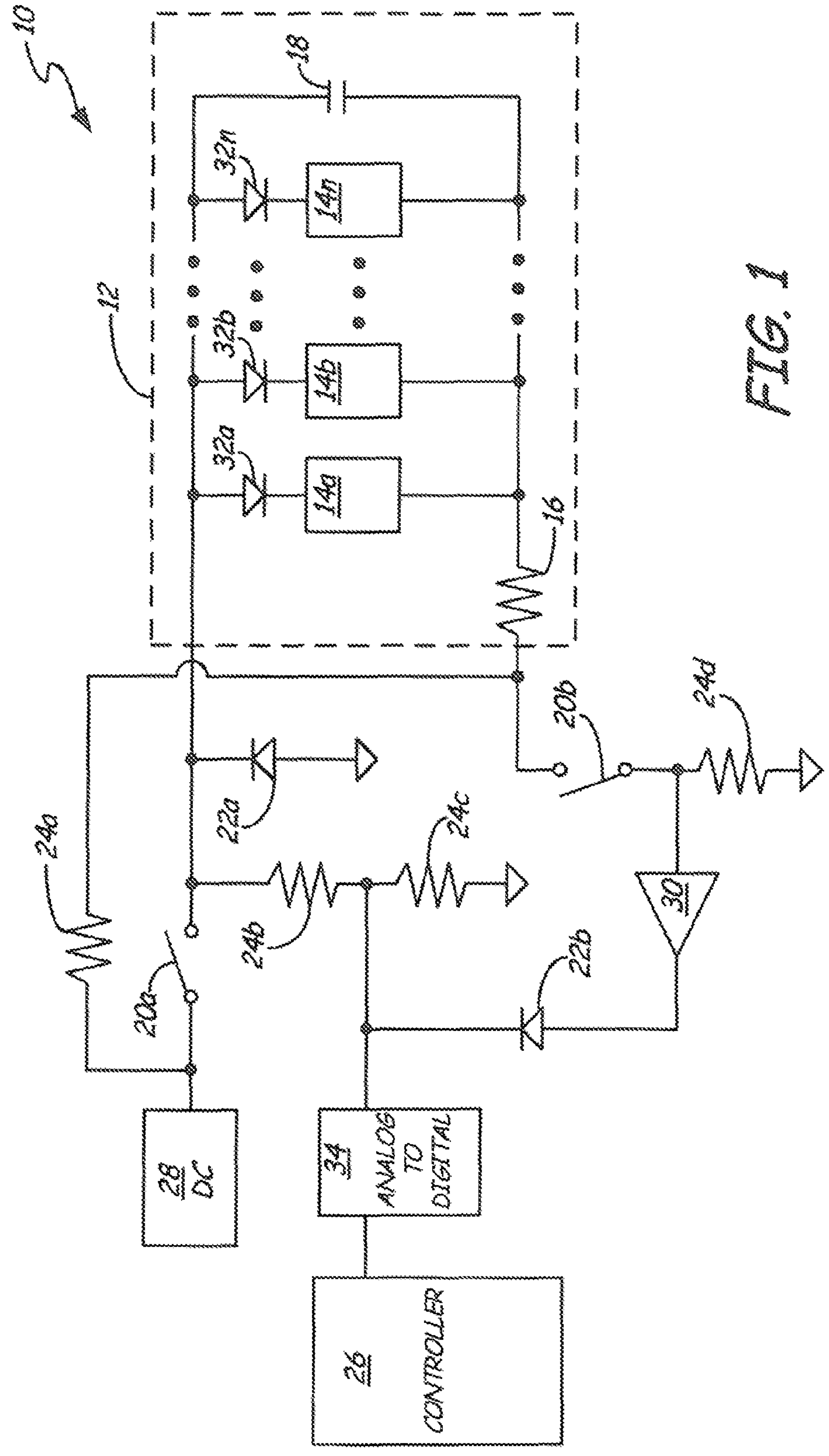
FIG. 1 is a block diagram illustrating an embodiment of the present invention.

FIG. 1 is a block diagram illustrating a system 10 for monitoring a wiring impedance 16 of a NAC 12. The system includes a plurality of notification devices 14*a*-14*n*, capacitor 18, switches 20*a*-20*b*, system diodes 22*a*-22*b*, reference resistors 24*a*-24*d*, controller 26, voltage source 28, amplifier 30, appliance diodes 32*a*-32*n*, and analog-to-digital converter 34. Wiring impedance 16 is illustrated schematically as a resistor, but represents the entire distributed wiring impedance of NAC 12. Values of capacitor 18, and resistors 24*a*-24*d* are known at the time of installation of system 10.

Controller 26 is capable of several functions, one of which is determining wiring impedance 16. Controller 26 may be incorporated in a main system controller, or may be a separate controller located, for example, within a power supply used to supply power to NAC 12. Controller 26 may comprise a digital microprocessor with a memory. Analog-to-digital converter 34 provides input to controller 26. If controller 26 determines there is a fault based upon the determined value of wiring impedance 16, controller 26 may, for example, send an output to the main system controller. The main system controller will then provide an output indicating the detected fault. This output may comprise any form of output, such as illuminating an LED, or providing an indication on a display.

Emergency notification circuit 12 provides power to the plurality of notification devices 14*a*-14*n*. In an emergency situation, switches 20*a*-20*b* are both closed such that appliance diodes 32*a*-32*n* are forward biased, and thus, notification devices 14*a*-14*n* are turned on. Switches 20*a*-20*b* may be, for example, mechanical switches, or solid-state switches such as metal-oxide-semiconductor field-effect transistors (MOSFETs). Switches 20*a*-20*b* may be controlled in several different ways, for example, by controller 26, or by a main emergency system controller. Notification devices 14*a*-14*n* may be any devices used for emergency notification such as sirens or strobe lights. Voltage source 28 is any source that provides a DC voltage.

During non-emergency system operation of system 10, switches 20*a*-20*b* are open. This reverses the voltage across notification devices 14*a*-14*n* which ensures that appliance diodes 32*a*-32*n* are reverse biased and thus, none of notification devices 14*a*-14*n* are turned on. When both switches 20*a*-20*b* are open, capacitor 18 is charged by current from voltage source 28, through resistor 24*a*, capacitor 18, wiring impedance 16, and resistors 24*b*-24*c*.

During charge-up of capacitor 18, controller 26 may determine the capacitance of capacitor 18. Although the nominal capacitance of capacitor 18 is specified at installation time of the circuit, the value of capacitance may be fine-tuned to obtain a more specific value. During charge-up of capacitor 18, controller 26 monitors the voltage across resistor 24*c*. By monitoring the voltage across resistor 24*c* over time, controller 26 can determine the time constant of the circuit involving capacitor 18, resistors 24*a*-24*c*, and wiring impedance 16. Because resistors 24*a*-24*c* are known, and the value of wiring impedance 16 is very small compared to that of resistors 24*a*-24*c*, the capacitance of capacitor 18 may be calculated based on the determined time constant. This calculation may be done, for example, by using a pre-programmed look-up table in controller 26 to obtain a capacitance based upon the measured time constant.

Wiring impedance 16 is then determined by discharging capacitor 18. Switch 20*b* is closed and switch 20*a* remains open in order to discharge capacitor 18. In this operating mode, system diode 22*a* is forward biased due to the orientation of charge of capacitor 18. Therefore, capacitor 18 is discharged through wiring impedance 16 and resistor 24*d*. Resistor 24*d* has a very small resistance, typically much smaller than that of wiring impedance 16. Because the resistance of resistor 24*d* is small, the voltage across resistor 24*d* is amplified for controller 26 by amplifier 30.

Controller 26 determines the value of wiring impedance 16 based upon the amplified voltage across resistor 24*d*. While capacitor 18 is discharging, controller 26 may measure the decay voltage across resistor 24*d*. By monitoring this voltage over time, controller 26 may determine the RC time constant of the discharge circuit which includes system diode 22*a*, capacitor 18, wiring impedance 16, and resistor 24*d*. Because values for system diode 22*a*, capacitor 18, and resistor 24*d* are known, controller 26 may calculate the value of wiring impedance 16 based upon the measured RC time constant. This calculation may be done, for example, by using a preprogrammed look-up table to obtain a wiring impedance based upon the measured time constant.

The system may charge and discharge capacitor 18 on a regular basis in order to monitor wiring impedance 16 over time. For example, some regulations may require that a problem with wiring impedance 16 be detected within 90 seconds of the problem occurring. In this case, capacitor 18 may be charged and discharged every 30 seconds. Controller 26 could then alert a main emergency system controller of a wiring impedance condition after detecting the same condition two charge/discharge cycles in a row. The main emergency system controller may then alert a technician so that the problem may be fixed.

Figure 2:
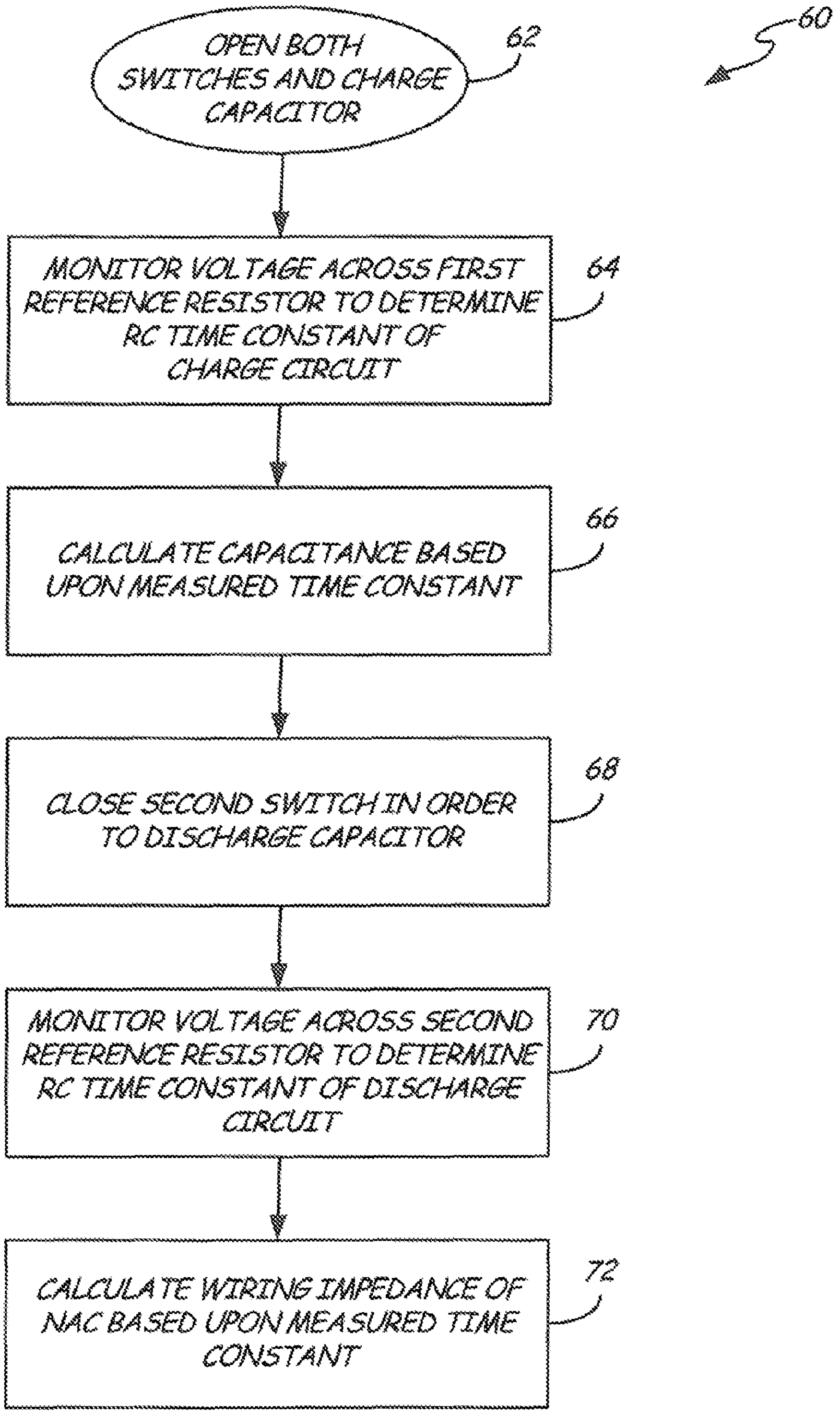
FIG. 2 is a flow chart illustrating a method of measuring a wire impedance according to an embodiment of the present invention.

FIG. 2 is a flow chart illustrating a method 60 according to an embodiment of the present invention. At step 62, the system opens both switches 20*a*-20*b* in order to charge capacitor 18. At step 64, the system measures the voltage across resistor 24*c* in order to determine an RC time constant of the charge circuit. At step 66, system 10 fine-tunes the value of capacitance of capacitor 18 based upon the measured RC time constant. At step 68, system 10 closes switch 20*b* in order to discharge capacitor 18. At step 70, controller 26 measures the voltage across resistor 24*d* in order to determine an RC time constant of the discharge circuit. At step 72, controller 26 uses the measured RC time constant for the discharge circuit to determine the wiring impedance of the NAC circuit.

In this way, the present invention describes a system and method for monitoring the wiring impedance of an emergency notification circuit. Although the present invention has been described with reference to preferred embodiments, workers skilled in the art will recognize that changes may be made in form and detail without departing from the spirit and scope of the invention.

The invention claimed is:

1. A system for measuring wiring impedance in an emergency notification circuit, the system comprising:

a capacitor;

a plurality of notification devices connected in parallel with the capacitor;

a reference resistor through which the capacitor may discharge; and a controller configured to determine the wiring impedance of the emergency notification circuit during discharge of the capacitor by monitoring voltage across the reference resistor;

wherein the controller is further configured to determine an RC time constant based upon the monitored voltage across the reference resistor during discharge of the capacitor, where R is a sum of resistance of the reference resistor and the wiring impedance, and C is capacitance of the capacitor, the controller determining the wiring impedance of the emergency notification circuit in response to the RC time constant.

2. The system of claim 1, wherein the system further comprises:

an analog-to-digital converter for converting the voltage across the reference resistor into a digital representation; and wherein the controller comprises a digital microprocessor and monitors the voltage across the reference resistor using the digital representation from the analog-to-digital converter.

3. The system of claim 1, wherein the system further comprises an amplifier for amplifying the voltage across the reference resistor during discharge of the capacitor.

4. A system for measuring wiring impedance in an emergency notification circuit, the system comprising:

a capacitor;

a plurality of notification devices connected in parallel with the capacitor;

a reference resistor through which the capacitor may discharge; and a controller configured to determine the wiring impedance of the emergency notification circuit during discharge of the capacitor by monitoring voltage across the reference resistor;

wherein the system further comprises a first switch and a second switch, wherein when both the first switch and the second switch are in an open state, the capacitor charges, and wherein when the first switch is in an open state, and the second switch is in a closed state, the capacitor discharges.

5. The system of claim 4, wherein when both the first switch and the second switch are in a closed state, the plurality of notification devices receive power.

6. A method for measuring wiring impedance of an emergency notification circuit, the method comprising:

charging a capacitor connected to the emergency notification circuit in parallel with a plurality of notification devices;

discharging the capacitor;

monitoring voltage across a first reference resistor while the capacitor is discharging; and determining the impedance of the emergency notification circuit based upon the monitored voltage across the first reference resistor;

wherein determining the impedance of the emergency notification circuit includes determining an RC time constant based upon the monitored voltage across the first reference resistor during discharge of the capacitor, where R is a sum of resistance of the first reference resistor and the wiring impedance, and where C is capacitance of the capacitor, the determining the wiring impedance of the emergency notification circuit being in response to the RC time constant.

7. A method for measuring wiring impedance of an emergency notification circuit, the method comprising:

charging a capacitor connected to the emergency notification circuit in parallel with a plurality of notification devices;

discharging the capacitor;

monitoring voltage across a first reference resistor while the capacitor is discharging; and determining the impedance of the emergency notification circuit based upon the monitored voltage across the first reference resistor;

wherein the method further comprises: monitoring voltage across a second reference resistor while the capacitor is charging; and determining a capacitance of the capacitor based upon the monitored voltage across the second reference resistor.

8. The method of claim 6, wherein determining the impedance of the emergency notification circuit is further based upon the determined RC time constant.

9. The method of claim 6, wherein determining the impedance of the emergency notification circuit further comprises amplifying the voltage across the first reference resistor.

10. The method of claim 6, wherein charging the capacitor comprises opening both a first switch and a second switch.

11. The method of claim 10, wherein discharging the capacitor comprises closing the second switch.

12. An emergency notification circuit, the circuit comprising:

a pair of wires;

an end-of-line capacitor connected between the pair of wires;

a plurality of notification devices connected between the pair of wires in parallel with the end-of-line capacitor;

a charge circuit connected to the pair of wires to charge the end-of-line capacitor;

a discharge circuit connected to the pair of wires to discharge the end-of-line capacitor; and a controller for determining a wiring impedance of the emergency notification circuit based upon a measured RC time constant of the discharge circuit;

wherein the controller is further configured to determine the RC time constant based upon the monitored voltage across the reference resistor during discharge of the end-of-line capacitor, where R is a sum of resistance of the reference resistor and the wiring impedance, and C is capacitance of the end-of-line capacitor, the controller determining the wiring impedance of the emergency notification circuit in response to the RC time constant.

13. An emergency notification circuit, the circuit comprising:

a pair of wires;

an end-of-line capacitor connected between the pair of wires;

a plurality of notification devices connected between the pair of wires in parallel with the end-of-line capacitor;

a charge circuit connected to the pair of wires to charge the end-of-line capacitor;

a discharge circuit connected to the pair of wires to discharge the end-of-line capacitor; and a controller for determining a wiring impedance of the emergency notification circuit based upon a measured RC time constant of the discharge circuit;

wherein the charge circuit includes a first reference resistor, wherein the controller monitors voltage across the first reference resistor while the end-of-line capacitor is charging in order to determine capacitance of the end-of-line capacitor.

14. The circuit of claim 12, wherein the discharge circuit includes a second reference resistor, and wherein the controller monitors the voltage across the second reference resistor during discharge of the end-of-line capacitor in order to determine the RC time constant of the emergency notification circuit, where R is a sum of resistance of the second reference resistor and the wiring impedance, and C is capacitance of the end-of-line capacitor.

15. The circuit of claim 14, wherein the system further comprises an amplifier that amplifies the voltage across the second reference resistor.

16. An emergency notification circuit, the circuit comprising:

a pair of wires;

an end-of-line capacitor connected between the pair of wires;

a plurality of notification devices connected between the pair of wires in parallel with the end-of-line capacitor;

a charge circuit connected to the pair of wires to charge the end-of-line capacitor;

a discharge circuit connected to the pair of wires to discharge the end-of-line capacitor; and a controller for determining a wiring impedance of the emergency notification circuit based upon a measured RC time constant of the discharge circuit;

wherein the circuit further comprises a first switch and a second switch, wherein the end-of-line capacitor charges when both the first switch and the second switch are open, and wherein the end-of-line capacitor discharges when the first switch is open and the second switch is closed.

17. The circuit of claim 16, wherein the plurality of notification devices receive power when both the first switch and the second switch are closed.

18. The circuit of claim 14, the circuit further comprising: an analog-to-digital converter for converting the voltage across the second reference resistor into a digital representation; and wherein the controller comprises a digital microprocessor and monitors the voltage across the second reference resistor using the digital representation from the analog-to-digital converter.

* * * * *